(12) United States Patent
Hornak

(10) Patent No.: US 6,198,345 B1
(45) Date of Patent: Mar. 6, 2001

(54) ERROR REDUCTION IN QUADRATURE POLYPHASE FILTERS WITH LOW OPEN LOOP GAIN OPERATIONAL AMPLIFIERS

(75) Inventor: Thomas Hornak, Portola Valley, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/469,192

(22) Filed: Dec. 21, 1999

(51) Int. Cl.[7] ........................................... H03K 5/00
(52) U.S. Cl. ..................... 327/552; 327/558; 327/336; 333/167
(58) Field of Search ................... 327/552, 362, 327/558, 557, 559, 336, 215; 333/172, 167

(56) References Cited

U.S. PATENT DOCUMENTS

| | | | |
|---|---|---|---|
| 4,914,408 | * | 4/1990 | Voorman ............................. 327/552 |
| 5,764,171 | * | 6/1998 | Stikvoort ............................. 327/215 |

* cited by examiner

*Primary Examiner*—Dinh T. Le
(74) *Attorney, Agent, or Firm*—Mike Camras

(57) ABSTRACT

A polyphase filter passes a desired frequency and attenuates an image frequency in many communication systems. The invention is an error correction circuit that compensates the polyphase filter for low open loop gain operational amplifiers. When multiple polyphase filters are used in communication circuits on a single integrated circuit (IC), the open loop gain of the operational amplifiers is limited by the IC's ability to dissipate power. The error correction circuit reduces the dependency of the polyphase filter performance on the low open loop gain of its operational amplifiers and hence, on temperature and IC process parameters.

16 Claims, 5 Drawing Sheets

ERROR REDUCTION IN QUADRATURE POLYPHASE FILTERS WITH LOW OPEN LOOP GAIN OPERATIONAL AMPLIFIERS

FIELD OF INVENTION

The invention is directed towards signal filtering with a polyphase filter, in particular, to provide error reduction in quadrature polyphase filters with low open loop gain operational amplifiers.

BACKGROUND

Many radio, video and data communication systems need to distinguish between a desired signal and an image signal and to attenuate the image signal relative to the desired signal. A polyphase filter performs this function.

For example, a heterodyne receiver with a desired signal of 110 MHz and a local oscillator frequency of 100 MHz generates a desired 10 MHz signal, which is easier to demodulate than the 110 MHz signal that requires difficult to build higher frequency components. However, an image signal of 90 MHz is also converted to an image 10 MHz signal that is not removed from the desired 10 MHz signal by conventional bandpass filters. A quadrature polyphase filter has an asymmetric frequency response resulting from the quadrature phase of its two input signals. It passes or attenuates a signal of the same frequency depending on the phase lag or lead between its two inputs. For instance, a quadrature polyphase filter, with a first and second input current, when driven by a quadrature mixer, will pass the desired signal with the second input current leading the first input current and attenuate the image signal with the second input current lagging the first input current.

The polyphase filter has a resonance frequency, at which its response is maximum. One implementation of a quadrature polyphase filter has two damped integrators matched in values and properties, each with an operational amplifier. An ideal polyphase filter has operational amplifiers of sufficiently high open loop gain so that their input voltages are negligibly small compared to their output voltages. As long as the input voltages remain negligibly small, the resonance frequency and the response of an ideal polyphase filter are independent of the input voltages and thus of the open loop gain of the operational amplifiers.

When multiple polyphase filters are used in communication circuits on a single integrated circuit (IC), the open loop gain of the operational amplifiers is limited by the IC's ability to dissipate power. And since the open loop gain of the operational amplifiers varies with IC process parameters and temperature, the polyphase filter's performance will also be dependent on IC process parameters and temperature. Thus, an undesirable result of the low open loop gain of the operational amplifiers of the polyphase filter is that the resonance frequency and response become dependent on IC process parameters and temperature.

SUMMARY

The invention is a circuit to provide error correction to polyphase filters with low open loop gain operational amplifiers. The polyphase filter includes a first and second damped integrator, a first and second cross coupling transconductor, and an inverter. The first transconductor is connected between the output of the second damped integrator and the input of the first damped integrator. The inverter is connected to the output of the first damped integrator and has an inverted output. The second transconductor is connected between the inverted output and the input of the second damped integrator. Each damped integrator includes an operational amplifier, a capacitor, and a feedback transconductor. Both the capacitor and the feedback transconductor connect between the inverting input and the output of the operational amplifier. The polyphase filter has a resonance frequency. The embodiments of this invention include error correction circuits for the polyphase filter: voltage based and current based.

The voltage based error correction circuit provides a correction voltage in series with each capacitor of the polyphase filter. Each correction voltage has a magnitude approximately equal to the magnitude of the input voltage of the corresponding damped integrator and a phase approximately equal to the phase of the input voltage of the corresponding damped integrator. The response of each damped integrator is corrected by subtracting the correction voltage from the capacitor voltage.

The current based error correction circuit provides a correction current to the input of each damped integrator of the polyphase filter. Each correction current has a magnitude proportional to the product of the magnitude of the input voltage, the frequency and the capacitance of the capacitor of the corresponding damped integrator and a phase leading the phase of the input voltage of the corresponding damped integrator by approximately 90°.

The correction voltages and currents reduce the dependency of the performance of the polyphase filter on the open loop gain of its operational amplifiers. Thus, the error correction reduces the dependency of the polyphase filter resonance frequency and response on the IC process parameters and temperature.

DETAILED DESCRIPTION OF THE PREFERRED EMBODIMENTS

Figure 1:
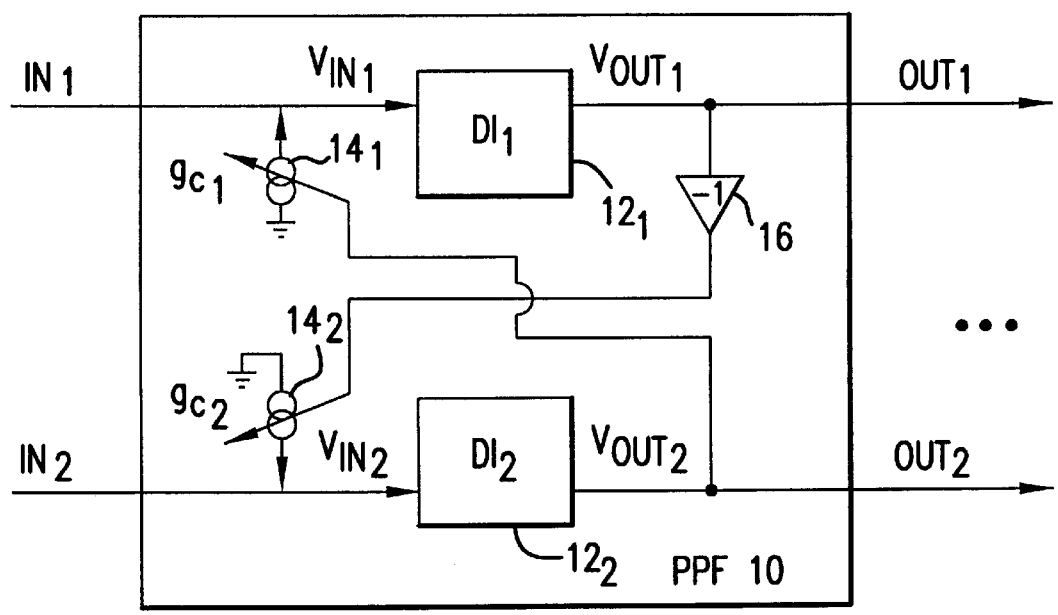
FIG. 1 is a block diagram of a polyphase filter.

FIG. 1 shows a block diagram of a polyphase filter 10. The polyphase filter 10 includes a first and second damped integrator $12_x$, which are matched, a first and second cross coupling transconductor $14_x$, which are matched, and an inverter 16. The first transconductor $14_1$ is connected between the output of the second damped integrator $12_2$ and the input of the first damped integrator $12_1$. The inverter 16 is connected to the output of the first damped integrator $12_1$ and has an inverted output. The second transconductor $14_2$ is connected between the inverted output and the input of the second damped integrator $12_2$. The cross coupling transconductors $14_x$ should have a high output impedance so that the input voltages do not affect their output currents. The polyphase filter 10 has a resonance frequency. When driving the polyphase filter by a quadrature mixer, the desired signal may result in the input to the first damped integrator $12_1$ leading the input to the second damped integrator $12_2$. Also, the image signal will result in the input to the first damped integrator $12_1$ lagging the input to the second damped integrator $12_2$. Thus, the polyphase filter will pass the desired signal and attenuate the image signal.

Figure 2:
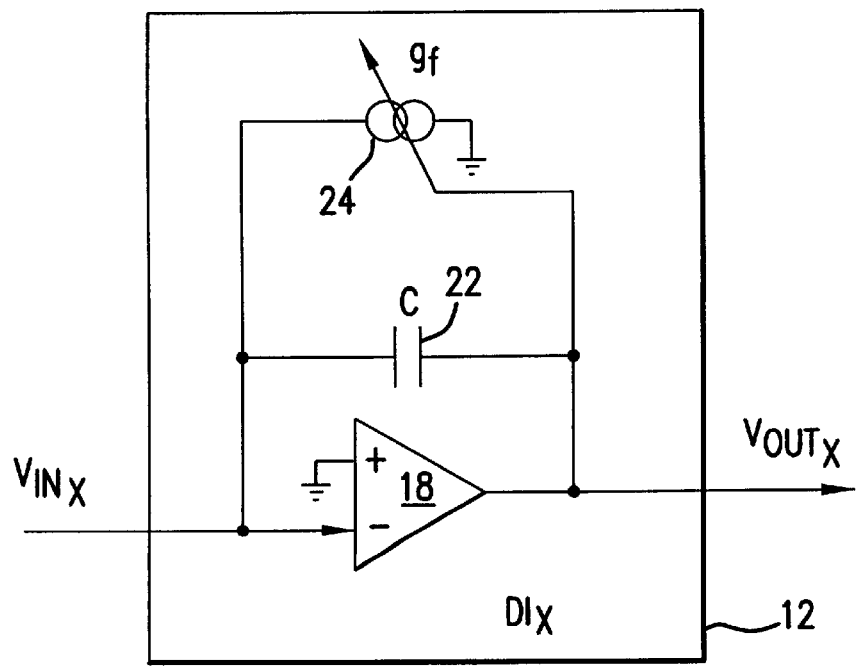
FIG. 2 is a schematic diagram of a damped integrator of FIG. 1 (prior art).

FIG. 2 shows a schematic diagram of one of the damped integrators $12_x$ of FIG. 1 according to prior art. The damped integrator 12 includes an operational amplifier 18, a capacitor 22, and a feedback transconductor 24. Both the capacitor 22 and feedback transconductor 24 connect between an inverting input and an output of the operational amplifier 18.

The voltage $V_{cap}$ across capacitor 22 in FIG. 2 is equal to the vector sum of the operational amplifier output voltage $V_{out}$ and its input voltage $V_{in}$:

$$V_{cap}=V_{out}+V_{in} \quad (1)$$

In an ideal polyphase filter 10, each operational amplifier 18 has sufficient open loop gain so that the input voltage $V_{in}$ is negligible compared to the output voltage $V_{out}$. In this ideal case, $V_{cap}=V_{out}$ and the value chosen for the transconductance $g_c$ of the cross coupling transconductors $14_x$ and the capacitance C of the capacitors 22 determine the resonance frequency fr of the polyphase filter 10:

$$f_r=g_c/(2\pi C) \quad (2)$$

When the open loop gain of each operational amplifier 18 is insufficient to make the input voltage $V_{in}$ negligible with respect to the output voltage $V_{out}$, the magnitude and the phase of the capacitor voltage $V_{cap}$ does not match the magnitude and the phase of output voltage $V_{out}$.

If the phase of the input voltage $V_{in}$ is in quadrature (±90°) with the phase of the output voltage $V_{out}$, the phase of the capacitor voltage $V_{cap}$ differs from the phase of the output voltage $V_{out}$. Each capacitor 22 requires an extra current to accommodate this phase difference. At the resonance frequency $f_r$, the extra current $I_e$ required by each capacitor 22 is:

$$I_e=2\pi f_r V_{in} C=V_{in} g_c \quad (3)$$

where $g_c$ is the transconductance of the first and second cross coupling transconductors $14_x$. This extra current is supplied by a change in the current of the feedback transconductor 24. For the feedback transconductor 24 to generate this extra currents $I_e$, the output voltage $V_{out}$ must change by an error voltage $V_e$ to:

$$V_{out}=V_{id} \pm V_e \quad (4)$$

where $V_{id}$ is the output voltage of an ideal operation amplifier with $V_{in}=0$ and the sign of $V_e$ is determined by whether input voltage $V_{in}$ leads or lags output voltage $V_{out}$. The error voltage $V_e$ is:

$$V_e=I_e/g_f=V_{in}g_c/g_f \quad (5)$$

where $g_f$ is the transconductance of each feedback transconductor 24. The input voltage $V_{in}$ can be expressed as:

$$V_{in}=(V_{id}+V_e)/A \quad (6)$$

where A is the open loop gain of each operational amplifier 18. Combining Equations (4), (5), and (6) and expressing $P=g_c/(Ag_f)$ for clarity:

$$V_{out}=V_{id} \pm V_e=V_{id}(1 \pm (P/(1 \mp P))) \quad (7)$$

To illustrate, when a non-ideal polyphase filter 10 has a cross coupling transconductance of $g_c=0.1$ mS, feedback transcondance of $g_f=0.01$ mS, and operational amplifier 18 open loop gain of A=30, the resulting output voltage is $V_{out}=1.5 V_{id}$ or $0.75 V_{id}$ depending on whether input voltage $V_{in}$ leads or lags output voltage $V_{out}$. Thus, the output voltage is in error by a substantial amount.

If the phase of input voltage $V_{in}$ is parallel (0° or 180°) with the phase of the output voltage $V_{out}$, a mismatch in magnitude results. In this case, there is no source of extra capacitor current having the proper phase, so the mismatch is compensated by a change in resonance frequency $f_r$. The voltage across each capacitor 22 is then $V_{cap}=V_{out} \pm V_{in}$, instead of the output voltage $V_{out}$ as is the case with $V_{in}=0$. The sign of $V_{in}$ is selected based on the 0° or 180° phase of the input voltage $V_{in}$ with respect to output voltage $V_{out}$. The resulting changed resonance frequency $f_i$ is:

$$f_i=f_r V_{out}/V_{cap}=f_r V_{out}/(V_{out} \pm V_{in})=f_r/(1 \pm A^{-1}) \quad (8)$$

where A is the open loop gain of each operational amplifier 18. For example, with an open loop gain of A=33 the changed resonance frequency is $f_i=0.97 f_r$ or $1.03 f_r$ depending on the 0° or 180° phase of the input voltage $V_{in}$ with respect to output voltage $V_{out}$.

If the phase of input voltage $V_{in}$ with respect to the output voltage $V_{out}$ is neither parallel nor in quadrature, both the resonance frequency and the response will be in error and may be analyzed by simple linear superposition.

Figure 3:
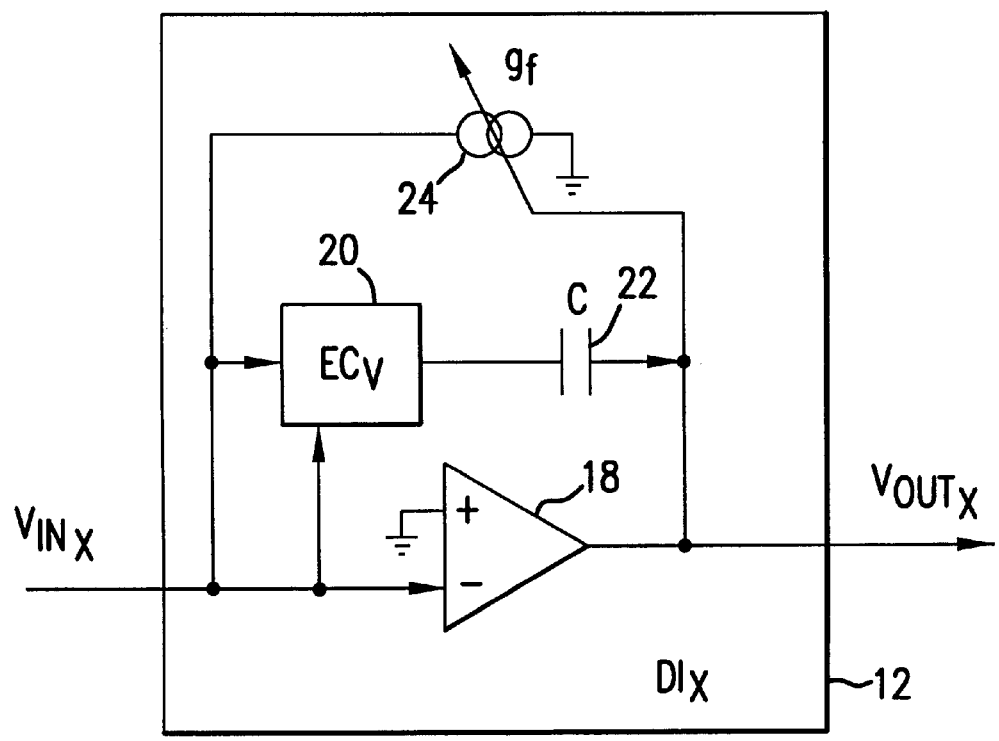
FIG. 3 is a schematic diagram of a damped integrator of FIG. 1 in one embodiment of the present invention.

FIG. 3 shows a schematic diagram of one of the damped integrators $12_x$ of FIG. 1 according to one embodiment of the invention. The damped integrator 12 includes an operational amplifier 18, an error correction voltage circuit $EC_v$ 20, a capacitor 22, and a feedback transconductor 24. The feedback transconductor 24 connects between an inverting input and an output of the operational amplifier 18. The error correction voltage circuit $EC_v$ 20 and the capacitor 22 are connected in series between the inverting input and output of the operational amplifier 18. The error correction voltage circuit $EC_v$ 20 also receives the inverting input of the operational amplifier 18 and generates a correction voltage. The feedback transconductor 24 should have a high output impedance so that the input voltage $V_{in}$ does not affect its output current.

Figure 4:
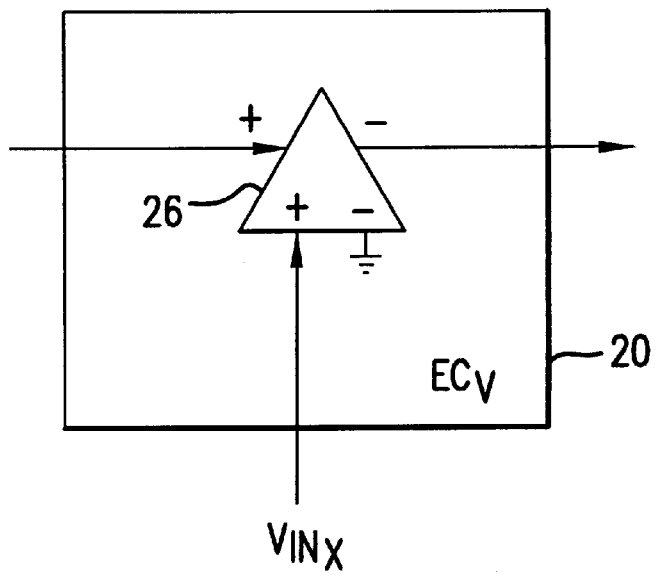
FIG. 4 is a schematic diagram of an error correction voltage circuit of FIG. 3.

FIG. 4 shows a schematic diagram of the error correction voltage circuit $EC_v$ 20 of FIG. 3. The error correction voltage circuit $EC_v$ 20 is a floating output voltage amplifier 26 with a gain of about one. The error correction voltage circuit $EC_v$ 20 has a non-inverting input and two floating output voltage terminals. Since the floating output carries the capacitor current, the serial impedance of the floating output must be negligible compared to the impedance of capacitor 22.

When the open loop gain of each operational amplifier 18 is insufficient to make the input voltage $V_{in}$ negligible with respect to the output voltage $V_{out}$, the correction voltage $V_c$ maintains the polyphase filter's resonance frequency and response the same as the ideal polyphase filter 10. Each correction voltage $V_c$ has a magnitude and phase approximately equal to the input voltage $V_{in}$. The error correction voltage circuit $EC_v$ 20 subtracts the correction voltage $V_c$ from the capacitor voltage $V_{cap}$ of Equation (1):

$$V_{cap}=V_{out}+V_{in}-V_c=V_{out}+V_{in}-V_{in}=V_{out} \quad (9)$$

Thus, the voltage $V_{cap}$ across capacitor 22 is equal to output voltage $V_{out}$ and does not require any extra current regardless of the magnitude and phase of the input voltage.

Figure 5:
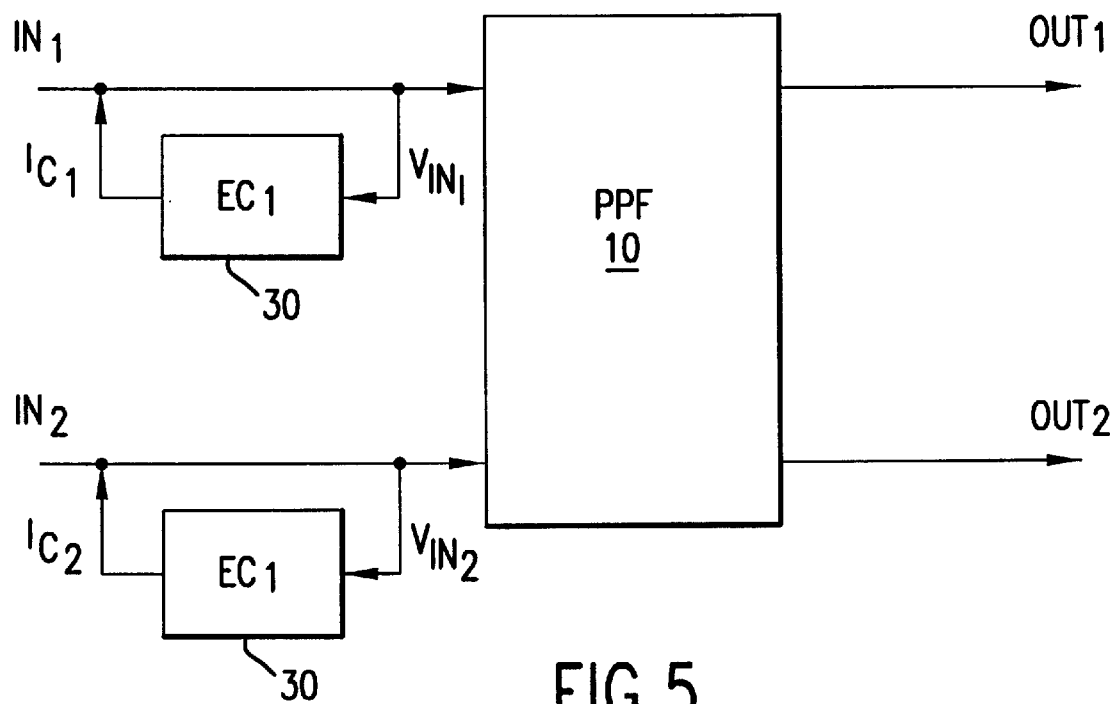
FIG. 5 is a block diagram of another embodiment of the invention.

FIG. 5 shows a block diagram of another embodiment of the invention: a polyphase filter 10 having two outputs and two inputs, each input with an error correction current circuit $EC_1$ 30. The error correction current circuit $EC_1$ 30 receives the input voltage of the corresponding damped integrator 12 and outputs a correction current to the input. Here, the capacitor voltage $V_{cap}$ and output voltage $V_{out}$ remain mismatched by the input voltage $V_{in}$, but the extra current $I_e$ required by the capacitors 22 due to the mismatch is supplied by the error correction current circuits $EC_1$ 30.

Figure 6:
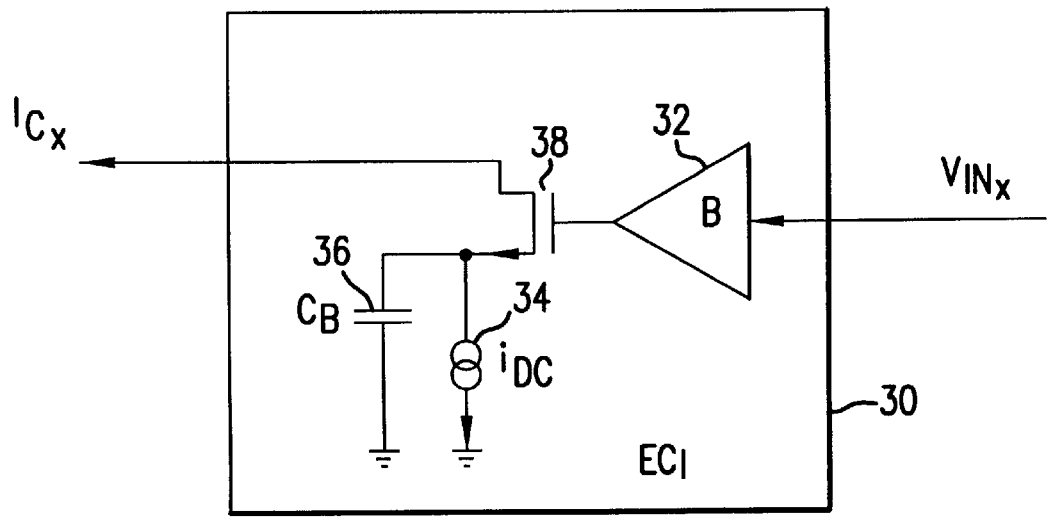
FIG. 6 is a schematic diagram of one embodiment of an error correction current circuit of FIG. 5.

FIG. 6 shows a schematic diagram of an embodiment of the error correction current circuit $EC_1$ 30 shown in FIG. 5. A buffer amplifier 32 has a non-inverting input and has an output connected to a transistor 38. The transistor 38 also receives a direct current sink 34 in parallel with a load capacitor 36. The transistor 38 has a negligible source resistance compared to the reactance of the load capacitor 36. The transistor 38 has a correction current output.

The buffer amplifier 32 with a voltage gain $G_B$ isolates its non-inverting input from the transistor 38, the direct current sink 34, and the load capacitor 36. The buffer amplifier 32 receives the input voltage $V_{in}$ and generates an output voltage that is sent to the transistor 38. The transistor 38 applies this output voltage to the load capacitor 36. The load capacitor 36 is chosen to have a capacitance $C_B$ that matches the capacitance C of the capacitor 22 divided by the voltage gain $G_B$ of the buffer amplifier 32. This load capacitance $C_B$ remains proportional to the capacitance C of capacitor 22 over temperature and IC process parameters since it may be formed on the same substrate. The larger the voltage gain $G_B$ of the buffer amplifier 32 is, the smaller the load capacitance $C_B$ can be. This is important for IC fabrication where the larger the capacitance of the load capacitor 36 is, the more substrate area it requires. The transistor 38 generates a correction current output. The correction current $I_c$ can be expressed as:

$$I_c = j(2\pi f C_B)V_{in}G_B = j(2\pi f C/G_B)V_{in}G_B = j(2\pi f C)V_{in} \quad (10)$$

This correction current has a magnitude proportional to the frequency f of the input signal, which makes it equal to the extra current required by the capacitors 22 at all frequencies f.

Figure 7:
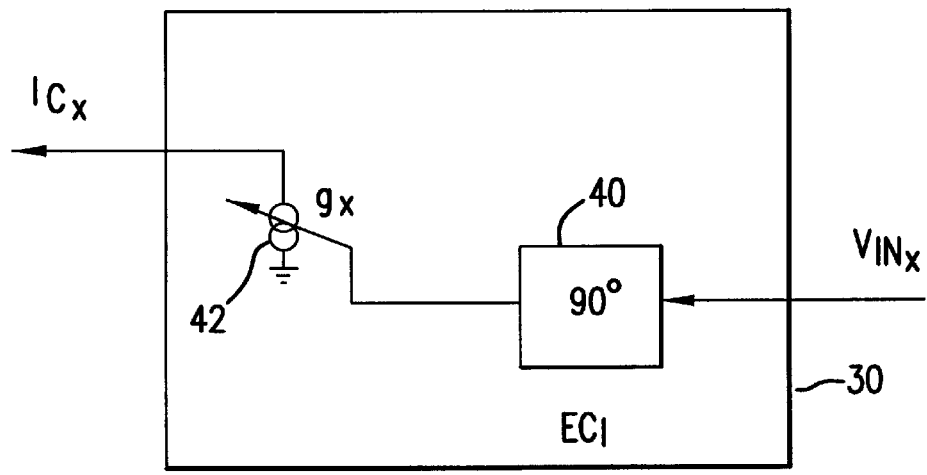
FIG. 7 is a schematic diagram of another embodiment of an error correction current circuit of FIG. 5.

FIG. 7 shows another embodiment of an error correction current circuit $EC_1$ 30 shown in FIG. 5. A 90° phase shifter 40 receives the input voltage and generates a phase shifted voltage. The phase shifted voltage is received by an error correction transconductor 42, which generates an error correction current. The transconductance $g_x$ of the error correction transconductor 42 is chosen such that:

$$g_x = 2\pi f_r C \quad (11)$$

Thus, a correction current from each error correction transconductor 42 is generated having a magnitude that is proportional to the product of the magnitude of the input voltage of the damped integrator 12, the resonance frequency, and the capacitance C of capacitor 22 of the damped integrator 12. The phase of the correction current leads the phase of the input voltage by approximately 90°. The correction current $I_c$ can be expressed as:

$$I_c = j(2\pi f_r C)V_{in} \quad (12)$$

The error correction current equals the extra current required by the capacitors 22 only at the resonance frequency $f_r$, but is slightly off at frequencies different than the resonance frequency. This error amounts to only about a few percent deviation of the −3 dB bandwidth.

Figure 8:
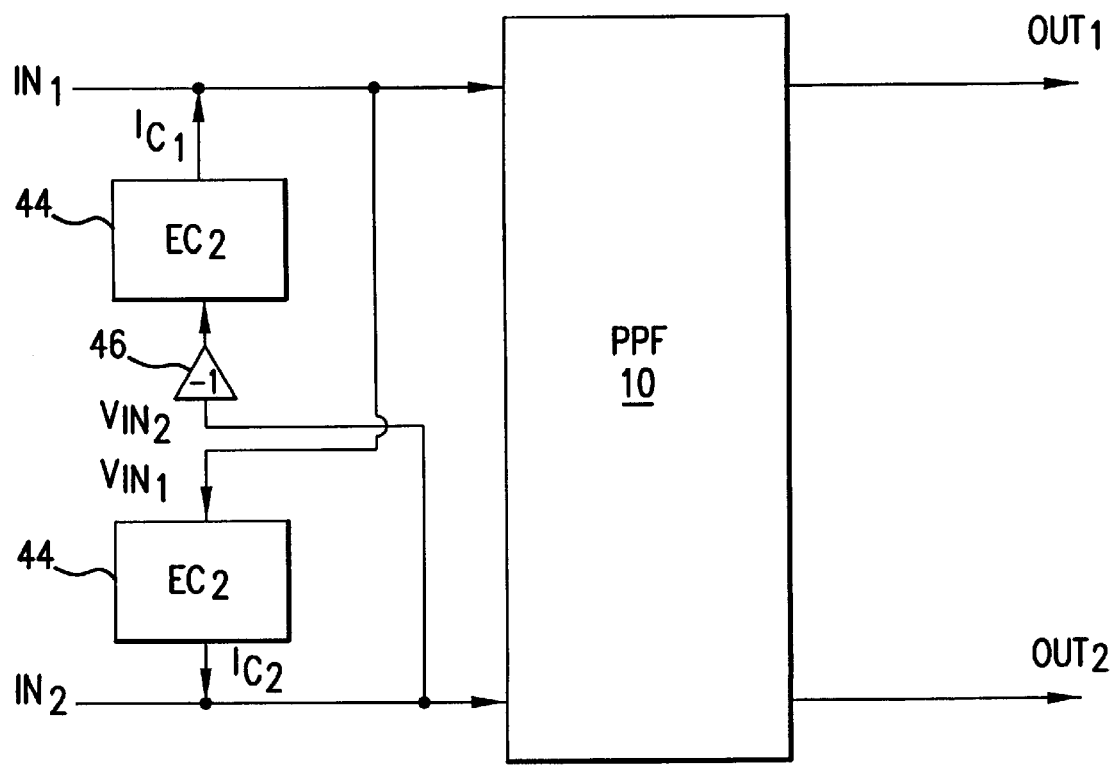
FIG. 8 is a block diagram of another embodiment of the invention.

FIG. 8 shows another embodiment of the invention: a polyphase filter 10 having a first and second output, a first and second input, a correction inverter 46, and a first and second error correction current circuit $EC_2$ 44 each generating a correction current. The correction inverter 46 is connected to the second input and has a correction inverted output. The first error correction current circuit $EC_2$ 44 has an input connected to the correction inverted output and outputs a correction current to the first input. The second error correction current circuit $EC_2$ 44 has an input connected to the first input and outputs a correction current to the second input.

Figure 9:
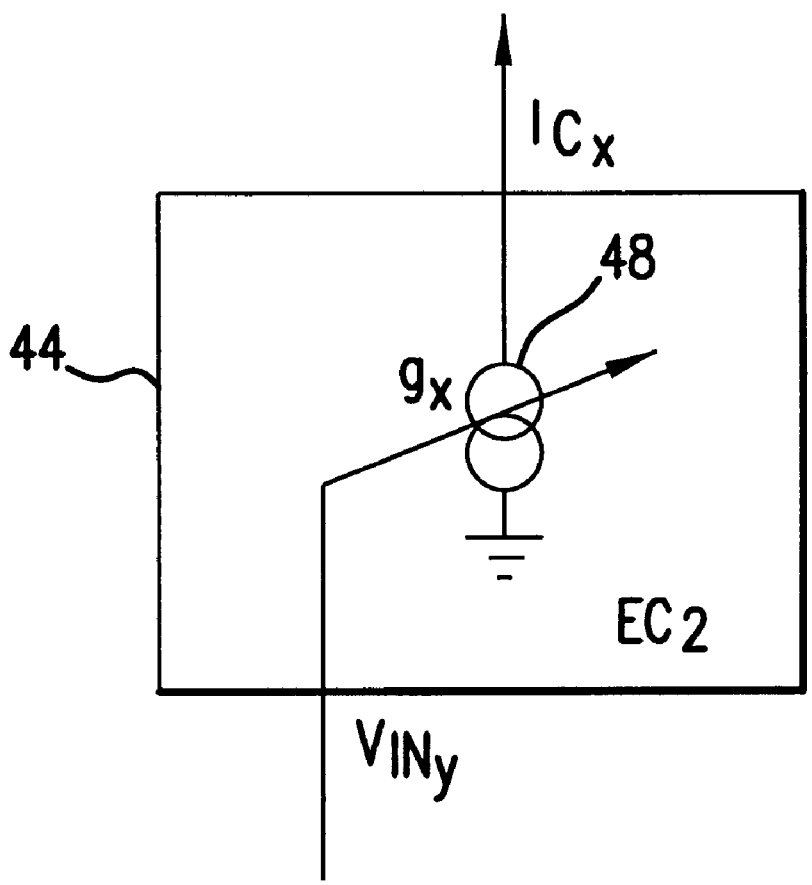
FIG. 9 is a schematic diagram of an error correction current circuit of FIG. 8.

FIG. 9 shows a schematic diagram of the error correction current circuit $EC_2$ 44 shown in FIG. 8. The error correction current circuit $EC_2$ 44 is a transconductor 48 with an input and output, having a transconductance according to Equation (11). This embodiment uses the 90° phase difference between the input voltages of the damped integrators $12_x$ to generate the 90° phase shift shown in FIG. 7. The correction inverter 46 ensures proper polarity. The transconductor 48 generates a correction current that has a magnitude proportional to the product of the magnitude of the input voltage from the opposing damped integrator 12, the resonance frequency, and the capacitance of capacitor 22 of the damped integrator 12 and a phase leading the phase of the input voltage of the corresponding damped integrator 12 by approximately 90°. The correction current is generated according to Equation (12).

By supplying the correction voltage or correction current to the corresponding damped integrator 12, the dependency of the polyphase filter 10 resonance frequency and response on the open loop gain of its operational amplifiers 18 are reduced or eliminated. The error correction reduces the dependency of the performance of the polyphase filter 10 on the IC process parameters and temperature.

The present invention is an elegant solution to achieve error correction in a polyphase filter 10. There are many possible ways to configure and implement these types of error correction. Although voltage based and current based circuits were described, a combination of voltage and current circuits could be implemented. The circuit elements described may be substituted with equivalent devices. For instance, resistors, whose current is also a function of voltage, can replace the transconductors. The polyphase filter may have N inputs and N outputs and the error correction may be implemented for each of the N terminals as described above for N=2. The error correction circuits are particularly useful for polyphase filters formed on a single substrate of an IC, but works equally well for discrete polyphase filters.

I claim:
1. A polyphase filter, comprising:
a first and second damped integrator, each having an input for receiving an input signal and output, each including,
an operational amplifier, having an input and output,
an error correction circuit connected in series with a capacitor, connected between the input and output, the error correction circuit connected to the input and generating a correction voltage, and
a feedback transconductor, connected between the input and the output;
an inverter, receiving the output of the first damped integrator, having an inverted output; and
a first and a second transconductor, the first transconductor connected between the output of the second damped integrator and the input of the first damped integrator, the second transconductor connected between the inverted output and the input of the second damped integrator.

2. A polyphase filter, as defined in claim 1, further comprising a single substrate, wherein the first and second damped integrator, the inverter, and the first and second transconductor are formed on the single substrate.

3. A polyphase filter, as defined in claim 1, wherein each correction voltage has a magnitude approximately equal to a magnitude of an input voltage of the corresponding damped integrator and a phase approximately equal to a phase of the input voltage of the corresponding damped integrator, wherein the correction voltage is subtracted from a capacitor voltage.

4. A polyphase filter, as defined in claim 3, wherein each error correction circuit is an amplifier.

5. A polyphase filter having a resonance frequency, comprising:
   a first and second damped integrator, each having an input for reciving an input signal at a frequency and output, each including,
       an operational amplifier, having an input and output,
       a capacitor, connected between the input and the output, and
       a feedback transconductor, connected between the input and the output;
   an inverter, receiving the output of the first damped integrator and having an inverted output;
   a first and a second transconductor, the first transconductor connected between the output of the second damped integrator and the input of the first damped integrator, the second transconductor connected between the inverted output and the input of the second damped integrator; and
   a first and second error correction circuit, each outputting a correction current to the input of the corresponding damped integrator, each having an input electrically connected to the input of one of the first and second damped integrator.

6. A polyphase filter, as defined in claim 5, further comprising a single substrate, wherein the first and second damped integrator, the inverter, the first and second transconductor, and the first and second error correction circuit are formed on the single substrate.

7. A polyphase filter, as defined in claim 5, wherein each correction current has a magnitude proportional to a product of a magnitude of an input voltage of one of the first and second damped integrator and one of the frequency and the resonance frequency and a phase leading a phase of the input voltage of the corresponding damped integrator by approximately 90°.

8. A polyphase filter, as defined in claim 5, wherein the first and second error correction circuit input connects to the input of the corresponding damped integrator.

9. A polyphase filter, as defined in claim 8, wherein each correction current has a magnitude proportional to a product of a magnitude of an input voltage of the corresponding damped integrator, the frequency, and a capacitance of the capacitor of the corresponding damped integrator and a phase leading a phase of the input voltage of the corresponding damped integrator by approximately 90°.

10. A polyphase filter, as defined in claim 9, each error correction circuit further comprising:
    a buffer amplifier, having an input and generating an output;
    a direct current sink;
    a load capacitor, connected to the direct current sink; and
    a transistor, receiving the buffer amplifier output, connected to the direct current sink, generating the correction current.

11. A polyphase filter, as defined in claim 8, wherein each correction current has a magnitude proportional to a product of a magnitude of an input voltage of the corresponding damped integrator, the resonance frequency, and a capacitance of the capacitor of the corresponding damped integrator and a phase leading a phase of the input voltage of the corresponding damped integrator by approximately 90°.

12. A polyphase filter, as defined in claim 11, each error correction circuit further comprising:
    a phase shifter, having an input and generating a phase shifted output voltage; and
    an error correction transconductor, receiving the phase shifted output voltage and generating the correction current.

13. A polyphase filter, as defined in claim 5, further comprising a correction inverter, receiving the input voltage of the second damped integrator and having a correction inverted output, wherein the first error correction circuit input connects to the correction inverted output and the second error correction circuit input connects to the input of the first damped integrator.

14. A polyphase filter, as defined in claim 13, further comprising a single substrate, wherein the first and second damped integrator, the inverter, the first and second transconductor, the first and second error correction circuit, and the correction inverter are formed on the single substrate.

15. A polyphase filter, as defined in claim 13, wherein each correction current has a magnitude proportional to a product of a magnitude of an input voltage of the opposing damped integrator, the resonance frequency, and a capacitance of the capacitor of the corresponding damped integrator and a phase leading a phase of the input voltage of the corresponding damped integrator by approximately 90°.

16. A polyphase filter, as defined in claim 15, wherein each error correction circuit is a transconductor.

* * * * *